(12) United States Patent
Sakata

(10) Patent No.: US 9,786,528 B2
(45) Date of Patent: Oct. 10, 2017

(54) SUBSTRATE SUPPORTING TABLE, SUBSTRATE PROCESSING APPARATUS, AND MANUFACTURE METHOD FOR SEMICONDUCTOR DEVICE

(75) Inventor: Masakazu Sakata, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 1294 days.

(21) Appl. No.: 13/407,091

(22) Filed: Feb. 28, 2012

(65) Prior Publication Data

US 2012/0222818 A1 Sep. 6, 2012

(30) Foreign Application Priority Data

Mar. 4, 2011 (JP) .................................. 2011-48047

(51) Int. Cl.
  *H01L 21/673* (2006.01)
  *H01L 21/67* (2006.01)
  *F28F 1/12* (2006.01)

(52) U.S. Cl.
  CPC ........ *H01L 21/67109* (2013.01); *F28F 1/126* (2013.01); *F28F 1/128* (2013.01); *H01L 21/673* (2013.01)

(58) Field of Classification Search
  CPC ................. H01J 37/32; H01J 37/32715; H01J 37/32724; H01L 21/67109; F28F 1/126; F28F 1/128; F28F 1/10; F28F 1/18; F28F 1/28; F28F 1/36; F28F 3/02; F28F 3/027

USPC ................. 118/728–733; 156/345.51–345.55
See application file for complete search history.

(56) References Cited

U.S. PATENT DOCUMENTS 5,203,958 A * 4/1993 Arai et al. ...................... 216/67
5,427,670 A * 6/1995 Baggerman et al. .... 204/298.09

FOREIGN PATENT DOCUMENTS

| CN | 101426359 | 5/2009 | |
|----|-----------|--------|---|
| JP | 06-280057 A | 10/1994 | |
| JP | 07-074234 A | 3/1995 | |
| JP | 2003-077895 | * 3/2003 | ......... H01L 21/3065 |
| JP | 2003-077895 A | 3/2003 | |
| JP | 2005-019660 A | 1/2005 | |
| JP | 2009-272535 A | 11/2009 | |

* cited by examiner

*Primary Examiner* — Yuechuan Yu
(74) *Attorney, Agent, or Firm* — Volpe and Koenig, P.C.

(57) ABSTRACT

The substrate supporting table includes a supporting plate that supports a substrate, a peripheral wall that encompasses a flow path of a coolant under the supporting plate and has an upper end enclosed by the supporting plate, a lower cover that encloses a bottom portion of the flow path and encloses a lower end of the peripheral wall. The substrate supporting table further includes a coolant supplying component that supplies a coolant through an upstream input of the flow path, a discharging component that discharges the coolant through a downstream output of the flow path, and a partition disposed between a supplying hole of the coolant supplying component and a discharging hole of the discharging component. A gap is formed between the partition and the bottom portion of the flow path.

11 Claims, 5 Drawing Sheets

SUBSTRATE SUPPORTING TABLE, SUBSTRATE PROCESSING APPARATUS, AND MANUFACTURE METHOD FOR SEMICONDUCTOR DEVICE

CROSS-REFERENCE TO RELATED APPLICATION(S)

This application is based upon and claims the benefit of priority from Japan Patent Application No. 2011-48047, filed on Mar. 4, 2011, the entire contents of which are incorporated herein by reference.

TECHNICAL FIELD

The present disclosure relates to a substrate supporting table which supports and heats a substrate, a substrate processing apparatus including the substrate supporting table, and a manufacture method for a semiconductor device which is performed by the substrate processing apparatus.

BACKGROUND

A substrate processing process of supplying plasma-processed gas onto a heated substrate to etch a surface of the substrate is performed as one process of manufacturing semiconductor devices such as DRAMs. In such a process, the substrate is mounted on the substrate supporting table whose temperature may be elevated and heated to a certain temperature, and then the plasma-processed gas is applied onto the heated substrate.

When performing plasma processing, it is preferable to maintain the temperature of the substrate to a constant. However, when the substrate is exposed to plasma, the substrate is heated by radiant heat from the plasma as well as heat conduction from the substrate supporting table. Therefore, in the above-described substrate processing process, the heating operation by the substrate supporting table is stopped after the start of applying the plasma onto the substrate.

However, when desiring to regulate the temperature of the substrate during the plasma processing, for example, at a temperature lower than or equal to 90 degrees Celsius, it is sometimes difficult to prevent the temperature of the substrate from rising by stopping the heating operation of the substrate supporting table.

SUMMARY

The present disclosure provides some embodiments of a substrate supporting table, a substrate processing apparatus, and a manufacture method for a semiconductor device, which can prevent the flux of a coolant from being excessively disturbed by a partition even when using a medium, such as a coolant, thus enhancing the cooling efficiency of the substrate supporting table.

According to some embodiments, in a substrate processing apparatus, a flow path for a cooling medium may be formed in the substrate supporting table. After the start of applying the plasma onto the substrate, the heating operation by the substrate supporting table may be stopped and the cooling medium can be simultaneously supplied to the flow path. In response, the heat dissipation of the substrate through the substrate supporting table may be facilitated (for example, see Japanese Patent Laid-open Publication No. 2003-077895).

By disposing a partition having a certain shape in the flow path of the cooling medium, the staying time (heat exchange time) of the medium in the flow path can be controlled, and thus, the cooling efficiency of the substrate supporting table can be enhanced. However, when using liquid (coolant) as the cooling medium, the flux of the coolant may be disturbed by the partition, and consequently, the cooling efficiency of the substrate supporting table may be degraded.

According to some embodiments, a substrate supporting table includes: a supporting plate configured to support a substrate; a peripheral wall configured to encompass a flow path being configured to pass a coolant under the supporting plate, an upper end of the peripheral wall being enclosed by the supporting plate; a lower cover configured to enclose a bottom portion of the flow path and a lower end of the peripheral wall; a coolant supplying component configured to supply a coolant through an upstream input of the flow path; a discharging component configured to discharge the coolant through a downstream output of the flow path; and a partition disposed between a supplying hole of the coolant supplying component and a discharging hole of the discharging component, and configured to form a gap between the partition and the bottom portion of the flow path.

According to some embodiments, provided is a substrate processing apparatus which includes: a processing chamber configured to process a substrate; a substrate supporting table disposed inside the processing chamber, and configured to support the substrate; a gas supplying part configured to supply a processing gas into the processing chamber; and a plasma generating component configured to change the processing gas, supplied to the processing chamber, into plasma; and an exhausting component configured to perform exhaust in the processing chamber, wherein, the substrate supporting table includes: a supporting plate configured to support the substrate; a peripheral wall configured to encompass a flow path being configured to pass a coolant under the supporting plate, an upper end of the peripheral wall being enclosed by the supporting plate; a lower cover configured to enclose a bottom portion of the flow path and a lower end of the peripheral wall; a coolant supplying component configured to supply a coolant through an upstream input of the flow path; a discharging component configured to discharge the coolant through a downstream output of the flow path; and a partition disposed between a supplying hole of the coolant supplying component and a discharging hole of the discharging component, wherein a gap is formed between the partition and the bottom portion of the flow path, and the substrate processing apparatus includes a control component configured to allow the coolant supplying component to supply the coolant and allow the discharging component to discharge the coolant, when the plasma generating component is generating the plasma.

According to some embodiments, provided is a method for manufacturing a semiconductor device which includes: loading a substrate into a processing chamber; supporting the substrate by a substrate supporting table, the substrate supporting table being disposed inside the processing chamber and including: a supporting plate configured to support the substrate; a peripheral wall configured to encompass a flow path being configured to pass a coolant under the supporting plate, an upper end of the peripheral wall being enclosed by the supporting plate; a lower cover configured to enclose a bottom portion of the flow path and a lower end of the peripheral wall; a coolant supplying component configured to supply a coolant through an upstream input of the flow path; a discharging component configured to discharge the coolant through a downstream output of the flow path; and a partition disposed between a supplying hole of the coolant supplying component and a discharging hole of the discharging component, wherein a gap is formed between the partition and the bottom portion of the flow path; supplying a processing gas into the processing chamber to perform exhaust, and simultaneously process the substrate with plasma generated from the processing gas supplied to the processing chamber; and unloading the processed substrate from inside the processing chamber, wherein, when processing the substrate with the plasma, the coolant supplying component supplies the coolant and the discharging component discharges the coolant.

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

(1) Configuration of a Substrate Processing Apparatus

Figure 1:
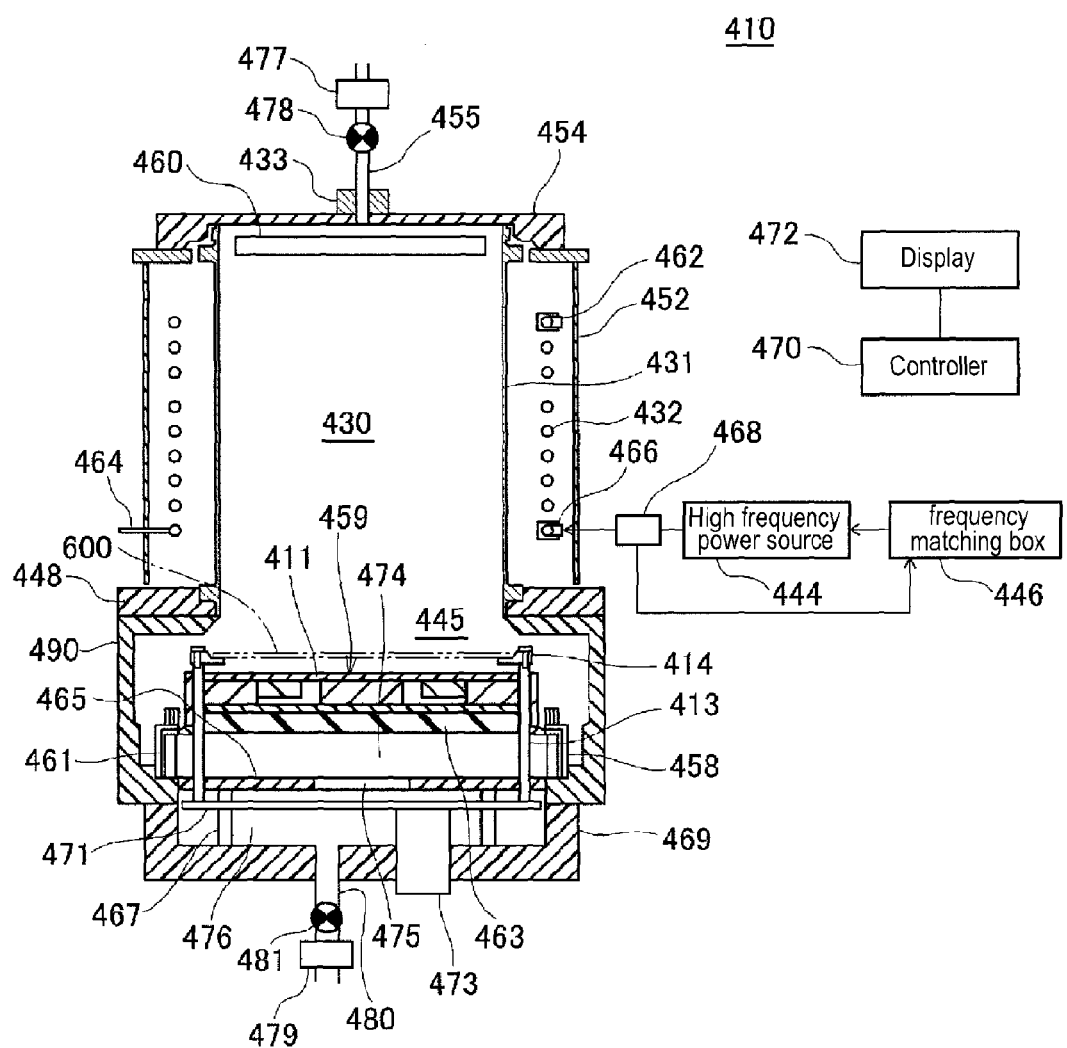
FIG. 1 is a vertical-sectional view illustrating a substrate processing apparatus, according to some embodiments.

FIG. 1 is a vertical-sectional view of a plasma processing unit 410 as a substrate processing apparatus, according to some embodiments.

The plasma processing unit 410 may, for example, be configured as a high frequency electrodeless discharging device that etches a semiconductor substrate or a semiconductor device through dry processing. As illustrated in FIG. 1, the plasma processing unit 410 includes a processing chamber 445 that processes a wafer 600 as a substrate, a susceptor table 411 as a substrate supporting table that is disposed inside the processing chamber 445 and supports the wafer 600, a heater 463 that heats the wafer 600 supported by the susceptor table 411, a gas supply source (not shown) that supplies a processing gas such as an etching gas into the processing chamber 445, a plasma generating component (not shown) that changes the processing gas supplied to the processing chamber 445 into plasma, and an exhausting component that exhausts the inside of the processing chamber 445.

The plasma processing unit 410, for example, includes a cylindrical reaction container 431 that is formed of high-purity quartz glass or ceramics. The reaction container 431 is disposed on a horizontal base plate 448 as a stand, such that an axis center thereof is perpendicular to the base plate 448. An upper end opening of the reaction container 431 is air-tightly sealed by a discal top plate 454. Inside the reaction container 431 is a plasma generating area 430.

An opening 433 for supplying gas into the reaction container 431 is located at an approximate center of the top plate 454. The opening 433 allows for a purge gas or the processing gas, such as the etching gas, to be supplied into the reaction container 431. A downstream end (downstream input) of a gas supplying pipe 455 is connected through the opening 433. A gas supplying source (not shown) supplies the processing gas or the purge gas through a mass flow controller 477 as a flow rate controller and an input/output valve 478, which are disposed in order descending from an upstream side of the gas supplying pipe 455. By controlling the mass flow controller 477 and the input/output valve 478, a gas supply or a flow rate from the gas introduced through the opening 433 may be controlled. In other words, the gas supplying component may be configured to supply gas to the combined subsystem of the gas supplying pipe 455, the gas supplying source (not shown), the mass flow controller 477, the input/output valve 478, and the opening 433.

A baffle plate 460, which rectifies gas supplied from the opening 433, is disposed at an upper portion of the reaction container 431. The baffle plate 460, for example, may be formed of quartz, but other materials may be utilized. The baffle plate 460 is approximately discal in shape. The baffle plate 460 is separated by a certain distance from an inner wall of the reaction container 431 and supported in a horizontal posture, in order for the gas supplied from the opening 433 to flow along the inner wall of the reaction container 431.

A wound resonant coil 432 and an outer shield 452, which is disposed at an outer circumference of the resonant coil 432 and electrically grounded, are disposed at an outer circumference of the reaction container 431. A high frequency power source 444 that supplies high frequency power and a frequency matching box 446 that controls an oscillation frequency of the high frequency power source 444 are connected to the resonant coil 432. A spiral resonator is configured by the resonant coil 432 and the outer shield 452. An RF sensor 468, which monitors a traveling wave and a reflected wave of the high frequency power, is disposed at an output of the high frequency power source 444. The RF sensor 468 monitors the high frequency power of the high frequency power source 444. A value based on the monitoring is fed back to the frequency matching box 446 by the RF sensor 468, thus allowing the frequency matching box 446 to minimize the reflected wave of the high frequency power.

In order for resonance to occur at a certain wavelength mode, the resonant coil 432 may have certain parameters, such as a winding diameter, a winding pitch, and a winding number. The resonant coil 432 generates a standing wave having a certain wavelength based on the set parameters. That is, the length of the resonant coil 432 may have a value corresponding to an integer multiple (one times, two times, . . . ), a half wavelength, or a quarter wavelength of the wavelength at a certain frequency of the high frequency power supplied from the high frequency power source 444. For example, the wavelength may vary as the frequency varies: 22 m at 13.56 MHz, 11 m at 27.12 MHz, and 5.5 m at 54.24 MHz.

The resonant coil 432 may be formed of an insulating material to have a flat shape, and supported by a plurality of supporting members (not shown) that are perpendicularly upright and disposed at an upper end surface of the base plate 448. It will be appreciated that other insulating materials may be possible. Additionally, both ends of the resonant coil 432 are electrically grounded. At least one end of the resonant coil 432 is grounded through a movable tap 462. Therefore, when initially installing the plasma processing unit 410 or changing a processing condition of the plasma processing unit 410, the length of the resonant coil 432 may be finely adjusted. The other end of the resonant coil 432 is disposed through a fixed ground 464. Also, an input is provided by a movable tap 466, between both the grounded ends of the resonant coil 432. Accordingly, when initially installing the plasma processing unit 410 or changing the processing condition of the plasma processing unit 410, an impedance of the resonant coil 432 may also be finely adjusted. That is, electrically grounded portions are respectively disposed at the both ends of the resonant coil 432. The input(s) provided by the movable tap 466 allows for power, from the high frequency power source 444, to be supplied to the resonant coils 432 between the grounded ends. As previously described, at least one of the grounded ends may be a variable ground capable of position adjustment. Furthermore, the positioning of the input(s) provided by the movable tap 466 may be variably adjusted. The resonant coil 432 configuration includes at least one variable ground and a variable input, thus allowing for a load impedance and a resonance frequency of the plasma generating component to be adjustable.

The outer shield 452 prevents electromagnetic waves from being leaked to the outside of the resonant coil 432, and is formed such that a capacitive component necessary for configuring a resonant circuit is formed between the resonant coil 432 and the outer shield 452. The outer shield 452 may be formed of a conductive material, such as an aluminum alloy, copper, or a copper alloy, and may be constructed to have a cylindrical shape. The outer shield 452 may be, for example, disposed at a distance of about 5 mm to about 150 mm from the outer circumference of the resonant coil 432.

The plasma generating component may be configured with the reaction container 431, the resonant coil 432, the outer shield 452, the movable taps 462 and 466, the fixing ground 464, the high frequency power source 444, and the frequency matching box 446. The gas supply source supplies the processing gas to the plasma generating component and, in parallel, the high frequency power source 444 supplies the high frequency power to the resonant coil 432, thereby changing the processing gas in the plasma generating area 430 to the plasma.

An opening at the lower end of the reaction container 431 is air-tightly connected to an opening at an upper end of a cylindrical processing container 490. The processing chamber 445, which is utilized for processing the wafer 600 (the substrate), is formed inside the processing container 490. The processing chamber 445 is functionally connected to the above-described plasma generating area 430. An opening at the lower end of the processing container 490 is air-tightly sealed by a bottom plate 469. The bottom plate 469 may be configured to have a concave structure (e.g., bowl shaped). The processing container 490, the reaction container 431, and the bottom plate 469 are disposed such that the central axes of these components are aligned in a vertical direction.

The susceptor table 411 may function as a substrate supporting table, and is supported by a plurality of supporting pillars 461 (for example, four pillars). The heater 463 is disposed under the susceptor table 411. The susceptor table 411, pillars 461, and heater 463 are all disposed inside the processing chamber 445. The heater 463 is connected to a heat-generating power source (not shown). The heat-generating power source may be electrically connected to the heater 463 to supply heat, and thus the wafer 600 supported on the susceptor table 411 may be heated. The gas supplied to the reaction container 431 or the plasma generated in the plasma generating area 430 is directed into the processing chamber 445, and applied onto the wafer 600 that is supported and heated by the susceptor table 411. Also, the interior of the susceptor table 411 is configured to include a flow path for passing a medium, such as a coolant, that allows for the heat dissipation of the susceptor table 411 and the wafer 600 to be facilitated. A configuration of the susceptor table 411 is described below, according to some embodiments.

An ascending/descending plate 471, which ascends/descends using a guide shaft 467 as a guide, is disposed under the susceptor table 411. At least three lifter pins 413 are perpendicularly disposed on the ascending/descending plate 471. The lifter pins 413 pass through an outer circumference portion of the susceptor table 411 in a perpendicular direction. A wafer support component 414 is disposed at an upper end of each of the lifter pins 413. The wafer support component 414 is extended in a central direction of the susceptor table 411, and supports an outer circumference of the wafer 600. The ascending/descending plate 471 is connected to an upper end of vertical shaft 473. The vertical shaft 473 may be connected to a driving component (not shown) through the bottom plate 469. The driving component may be utilized to control the ascending and/or descending motions of the vertical shaft 473, and thus enable the wafer supporting component 414 to be positioned along a vertical axis via the operations of the ascending/descending plate 471 and the lifter pins 413. Furthermore, the wafer 600 supported on the wafer support component 414 may be moved and mounted onto the susceptor table 411, or the wafer 600 supported on the susceptor table 411 may be moved and mounted onto the wafer supporting component 414.

A cylindrical baffle ring 458 is disposed under the susceptor table 411 to separate the processing chamber 445 from an area under the susceptor table 411. The area (separated by the baffle ring 458) under the susceptor table 411 is functionally connected to the processing chamber 445 through a plurality of ventilating holes (not shown) that are formed in the baffle ring 458. The area (separated by the baffle ring 458) under the susceptor table 411 is divided vertically by an exhausting plate 465. The exhausting plate 465 is horizontally supported on the bottom plate 469 through the guide shaft 467. A first exhausting chamber 474 (separated by the susceptor table 411, the baffle ring 458, and the exhausting plate 465) is formed on the exhausting plate 465 and a second exhausting chamber 476 (separated by the exhausting plate 465 and the bottom plate 469) is formed under the exhausting plate 465. The first exhausting chamber 474 and second exhausting chamber 476 are functionally connected to each other through an exhaust connection hole 475 that is formed in the exhausting plate 465.

An upstream end (upstream output) of an exhausting pipe 480 is connected to the bottom portion of the second exhausting chamber 476 via through the bottom plate 469. The exhausting pipe 480 may be oriented, for example, through approximately the center of the bottom plate 469. The exhausting pipe 480 additionally includes a pressure sensor (not shown), an Auto Pressure Controller (APC)

valve 481 for pressure control, and an exhausting device 479, all of which are disposed in order descending from an upstream side of the exhausting pipe 480. The exhausting device 479 may be driven by adjusting the degree to which the APC valve 481 is opened. The APC valve 481 may be adjusted based on pressure information detected by the pressure sensor (not shown). The exhausting pipe 480 performs a vacuum exhaust such that a pressure in the processing chamber 445 reaches a certain pressure (vacuum degree). The exhausting component comprises one or more of following: the exhausting pipe 480, the APC valve 481, the pressure sensor, and the exhausting device 479 and/or other features of the plasma processing unit 410 that functionally support the exhausting operation.

A controller 470 is connected to the mass flow controller 477, the input/output valve 478, the high frequency power source 444, the frequency matching box 446, the RF sensor 468, the heater 463, the heat-generating power source, the driving component, the pressure sensor, the APC valve 481, and the exhausting device 479, and controls respective operations thereof. A display 472 may be additionally connected to the controller 470. For example, the display 472 may display a monitored result of a reflected wave detected by the RF sensor 468, data detected by one or more sensors of the plasma processing unit 410, and so on.

(2) Configuration of Susceptor Table

As described above, the susceptor table 411 includes a flow path for passing a medium, such as a coolant. By supplying the coolant into the flow path, the heat dissipation of the susceptor table 411 and the wafer 600 can be facilitated. A detailed configuration of the susceptor table 411 is described with reference to FIGS. 2 to 6B.

Figure 2:
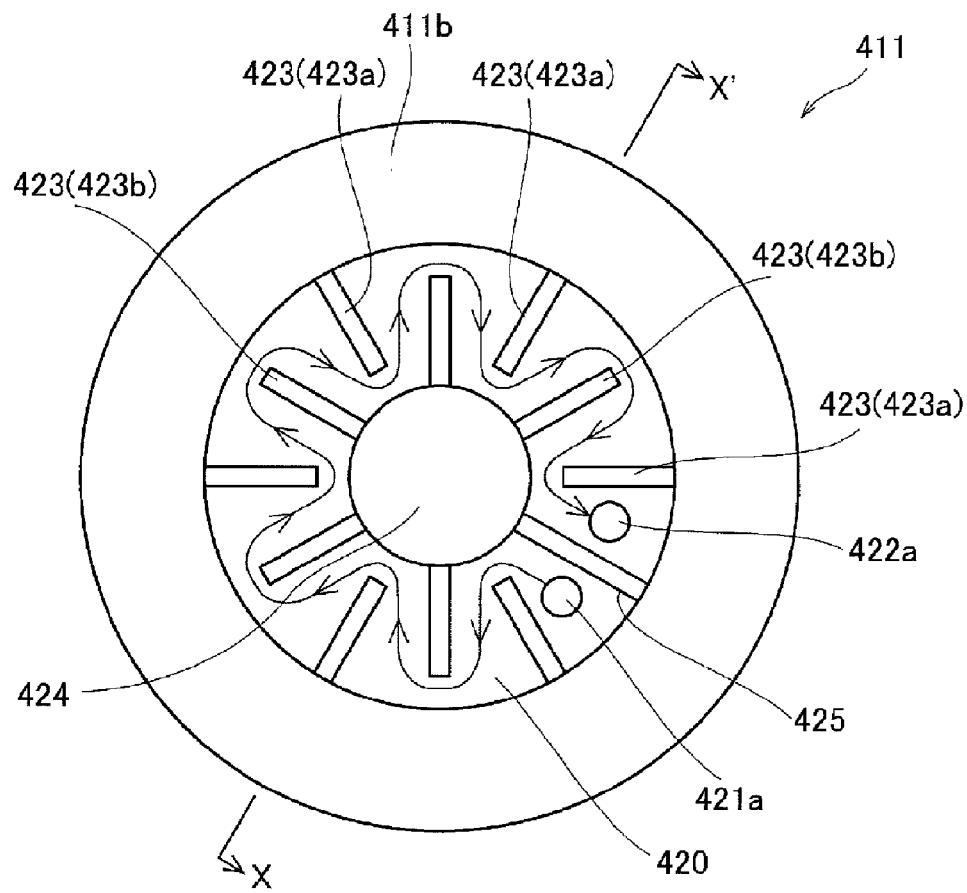
FIG. 2 is a horizontal-sectional view illustrating a substrate supporting table, according to some embodiments.
Figure 3:
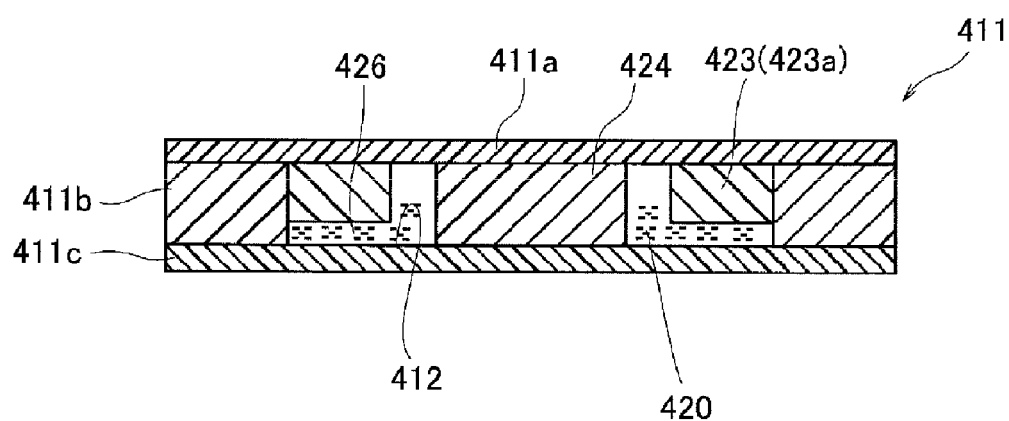
FIG. 3 is a vertical-sectional view illustrating a substrate supporting table, according to some embodiments.

FIG. 2 is a horizontal-sectional view of the susceptor table 411. FIG. 3 is a sectional view taken along X-X' line of FIG. 2.

As illustrated in FIGS. 2 and 3, the susceptor table 411 includes a discal supporting plate 411a that supports the wafer 600 and a cylindrical peripheral wall 411b that encompasses a flow path 420 for passing a coolant under the supporting plate 411a. It will be appreciated that the discal supporting plate 411a encloses an upper end of the cylindrical peripheral wall 411b and extends over the flow path 420. The susceptor table 411 also includes a discal lower cover 411c that encloses a lower end of the peripheral wall 411b and extends over a bottom portion 412 of the flow path 420. A supporting surface for supporting the wafer 600 is formed at a top end of the supporting plate 411a. The supporting plate 411a may be formed of high-purity quartz glass, ceramics or the like to prevent metal contamination of the wafer 600. A pillar-shaped member 424, which connects the supporting plate 411a and the lower cover 411c, is disposed in a region that is surrounded by the peripheral wall 411b. In some embodiments, the above-described flow path 420 is formed in a ring shape to surround the pillar-shaped member 424.

The susceptor table 411 further includes a coolant supplying component that is configured to supply a coolant through an upstream input of the flow path 420, and a discharging component that discharges the coolant through a downstream output of the flow path 420. A supplying hole 421a of the coolant supplying component is formed at the upstream input of the flow path 420. A discharging hole 422a of the coolant supplying component is formed at the downstream input of the flow path 420. An inner wall 425, which contacts the lower cover 411c and connects the pillar-shaped member 424 and the peripheral wall 411b, is formed between the supplying hole 421a and the discharging hole 422a. That is, the inner wall 425 prevents the flow of the coolant between the supplying hole 421a and the discharging hole 422a. The coolant supplying component may additionally include a supplying pipe (not shown) for the coolant, and the discharging component may additionally include a discharging pipe (not shown) for the coolant. An upstream end of the supplying pipe and a downstream end of the discharging pipe may be configured to seal the processing chamber 445 and can be extended to an outer side of the processing chamber 490. The upstream end of the supplying pipe and the downstream end of the discharging pipe may be connected to each other through a heat exchanger or a thermal cycler (not shown), and thus, the coolant may be maintained at a constant temperature as it is circulated through the flow path 420.

<Disposition of Partition>

As illustrated in FIGS. 2 and 3, one or more partitions 423 are disposed in the flow path 420 between the supplying hole 421a and the discharging hole 422a. The partitions 423 are disposed in a radial direction, which intersects with an outer circumference direction of the peripheral wall 411b. In some embodiments, the plurality of partitions 423 includes peripheral wall sided partitions 423a that extends from a wall surface of the peripheral wall 411b, and pillar-shaped sided partitions 423b that extends from a wall surface of the pillar-shaped member 424. The peripheral wall sided partitions 423a and the pillar-shaped sided partitions 423b are alternately disposed at approximate circumference equiangular pitches to have a radial shape. Furthermore, turning points of the flow path 420 of the coolant are respectively formed in a gap between the peripheral wall side partition 423a and the pillar-shaped member 424, and a gap between the pillar-shaped side partition 423b and the peripheral wall 411b. Therefore, the coolant meanders through the flow path 420 in a zigzag shape as it flows through a large area of the susceptor table 411. As a result, an entire area of the susceptor table 411, namely, an entire surface of the wafer 600 is cooled more uniformly. Thus, in-surface temperature uniformity is enhanced.

<Disposition of Supplying Hole>

Figure 5A:
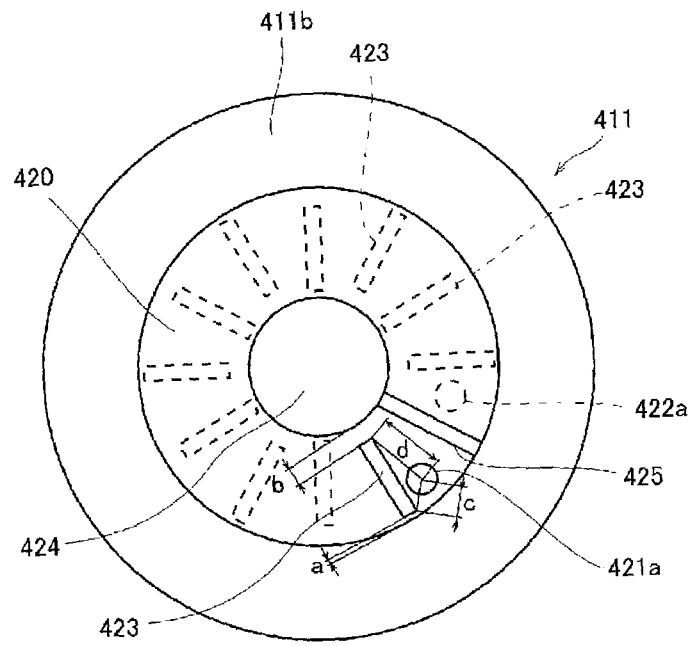
FIGS. 5A and 5B are views for illustrating a positional relationship between a partition and a supply hole for receiving coolant in a substrate supporting table, according to some embodiments.
Figure 5B:
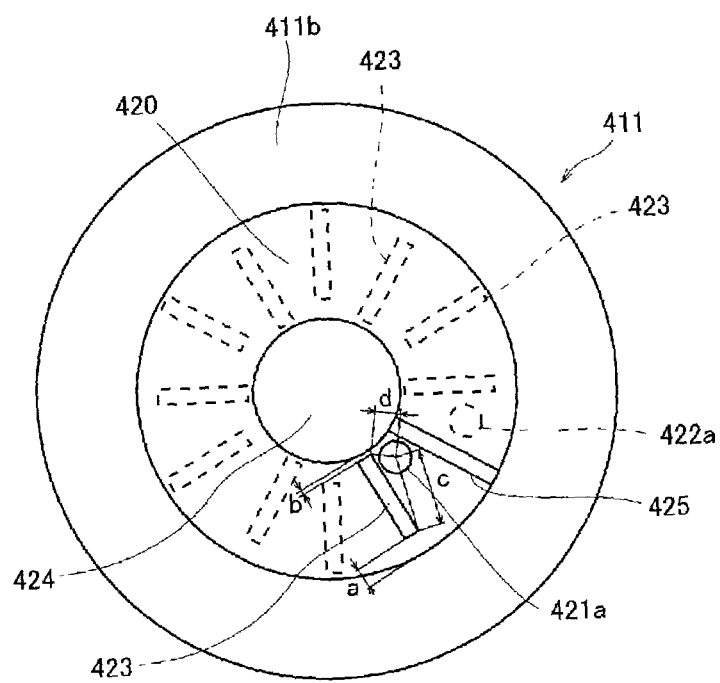

FIGS. 5A to 5B are views for illustrating positional relationship between a partition 423 and a supplying hole 421a of a coolant supplying component, according to some embodiments. As illustrated in FIGS. 5A and 5B, the supplying hole 421a of the coolant supplying component is formed between the partition 423a and the inner wall 425. For illustration purposes, a distance between the peripheral wall 411b and an end portion at a peripheral wall 411b side of a partition 423 adjacent to the supplying hole 421a is a first distance "a". A distance between the pillar-shaped member 424 and an end portion at a pillar-shaped member 424 side of the partition 423 is a second distance "b". A distance between the end portion at the peripheral wall 411b side of the partition 423 and the supplying hole 421a of the coolant supplying component is a third distance "c". A distance between the end portion at the pillar-shaped member 424 side of the partition 423 and the supplying hole 421a of the coolant supplying component is a fourth distance "d". In some embodiments, as illustrated in FIG. 5A, when the first distance "a" is shorter than the second distance "b" (when the partition 423 is disposed near the peripheral wall 411b), the supplying hole 421 a is disposed at a position (position near to the peripheral wall 411b) that allows the third distance "c" to become shorter than the fourth distance "d". Also, as illustrated in FIG. 5B, when the second distance "b" is shorter than the first distance "a" (when the partition 423 is disposed near the pillar-shaped member 424), the supplying hole 421a is disposed at a position (position near to the pillar-shaped member 424) that allows the fourth distance "d" to become shorter than the third distance "c". Also, although not shown, when the first distance "a" is equal to the second distance "b", the supplying hole 421a is disposed at a position that allows the third distance "c" to become equal to the fourth distance "d". Also, when the partition 423 contacts the peripheral wall 411b, the first distance "a" becomes zero. Also, when the partition 423 contacts the pillar-shaped member 424, the second distance "b" becomes zero.

By disposing the supplying hole 421a at each of the above-described positions, namely, by disposing the supplying hole 421a at a position that is away from the turning point, the coolant can be directed to flow even through the position that is away from the turning point. As a result, stagnation of the coolant can be prevented, and thus, the in-surface temperature uniformity of the susceptor table 411, e.g., the wafer 600, can be better enhanced.

<Disposition of Discharging Hole>

Figure 6A:
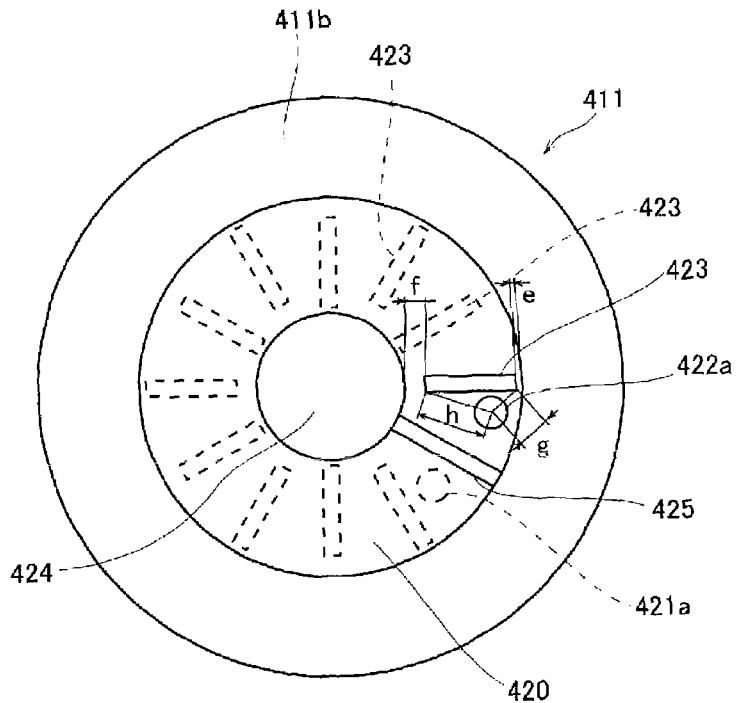
FIGS. 6A and 6B are views for illustrating a positional relationship between a partition and a discharging hole for discharging coolant from a substrate supporting table, according to some embodiments.
Figure 6B:
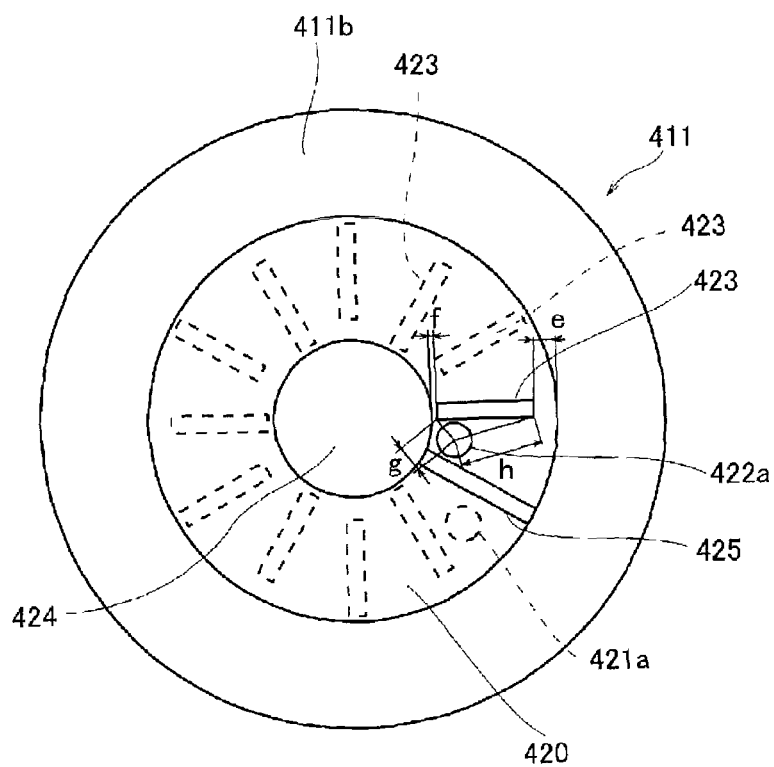

FIGS. 6A and 6B are views for illustrating a positional relationship between the partition 423 and a discharging hole 422a of a discharging component, according to some embodiments. As illustrated in FIGS. 6A and 6B, the discharging hole 422a of the discharging component is formed between the partition 423 and the inner wall 425. For illustration purposes, a distance between the peripheral wall 411b and an end portion at a peripheral wall 411b side of a partition 423 adjacent to the discharging hole 422a is a first distance "e". A distance between the pillar-shaped member 424 and an end portion at a pillar-shaped member 424 side of the partition 423 is a second distance "f". A distance between the end portion at the peripheral wall 411b side of the partition 423 and the discharging hole 422a of the discharging component is a third distance "g". A distance between the end portion at the pillar-shaped member 424 side of the partition 423 and the discharging hole 422a of the discharging component is a fourth distance "h". In this case, as illustrated in FIG. 6A, when the first distance "e" is shorter than the second distance "f" (when the partition 423 is disposed near the peripheral wall 411b), the discharging hole 422a is disposed at a position (position near to the peripheral wall 411b) that allows the third distance "g" to become shorter than the fourth distance "h". Also, as illustrated in FIG. 6B, when the second distance "f" is shorter than the first distance "e" (when the partition 423 is disposed near the pillar-shaped member 424), the discharging hole 422a is disposed at a position (position near to the pillar-shaped member 424) that allows the fourth distance "h" to become shorter than the third distance "g". Additionally, although not shown, when the first distance "e" is equal to the second distance "f," the discharging hole 422a is disposed at a position that allows the third distance "g" to become equal to the fourth distance "h". Furthermore, when the partition 423 contacts the peripheral wall 411b, the first distance "e" becomes zero. When the partition 423 contacts the pillar-shaped member 424, the second distance "f" also becomes zero.

By disposing the discharging hole 422a at each of the above-described positions, namely, by disposing the discharging hole 422a at a position that is away from the turning point, the coolant can certainly flow even through the position that is away from the turning point. As a result, the stagnation of the coolant can be prevented, and thus, the in-surface temperature uniformity of the susceptor table 411, e.g., the wafer 600, can be better enhanced.

<Gap Under Partition>

As described above, liquid coolant may be used as the medium that flows in the flow path 420. The liquid coolant has higher specific heat and heat conductivity than that of gas. Therefore, the cooling efficiency of the susceptor table 411 can be increased compared to a case where gas is used as the medium through the flow path 420. Also, the flow rate of the medium can be reduced, thus saving costs.

In some embodiments, when liquid coolant is used as the medium through the flow path 420, the flow of the medium may be regulated or restricted depending on the shape of the partition 423. Since the liquid coolant is heavy, unlike gas, the coolant can be stagnated at the bottom portion 412 side of the flow path 420. Since it is difficult for stagnated coolant to pass over the partition 423, the coolant may be locally left (stagnate) without flowing in the flow path 420, also depending on the shape of the partition 423. Additionally, depending on the shape of the partition 423, a high pressure may be applied to an end portion of the partition 423 at each of the turning points of the flow path 420, and thus, the flowing of the coolant may be further restricted, or the flow speed of the coolant may be further changed. As a result, the cooling efficiency of the susceptor table 411 may degrade locally, and thus the in-surface temperature uniformity can be reduced.

Therefore, referring again to FIG. 3, a gap 426 having a certain height is formed between the partition 423 and the bottom portion 412 of the flow path 420. By providing the gap 426, the flow of the coolant can be prevented from being excessively disturbed by the partition 423. That is, although the coolant stagnates at the bottom portion 412 of the flow path 420, since the gap 426 is formed near the bottom portion 412 of the flow path 420, the flow path of the coolant may be secured. As a result, the coolant can circulate without stagnation. According to some embodiments, since the coolant flows evenly through the gap 426 as well as any gaps between the turning points, pressure applied to an end portion of the partition(s) 423 can be reduced by the flowing of the coolant, and thus, the flow path of the coolant can be further secured. Additionally, the change of the flow speed of the coolant can be minimized, and thus, the in-surface uniformity of the cooling efficiency can be further enhanced. Accordingly, the entire area of the susceptor table 411, namely, the entire surface of the wafer 600 can be cooled more uniformly and efficiently.

Moreover, the flow rate or staying time (i.e., cooling efficiency) of the coolant flowing in the flow path 420 may be freely readjusted according to one or more parameter including, but not limited to, number, shape, dimension, and disposition direction of the partition 423 and the size of the gap 426.

(3) Substrate Processing Process

In some embodiments, as an example of one process of a manufacture process for a semiconductor device, the following description is made on a substrate processing process for etching a surface of the wafer 600 by supplying plasma-processed gas onto the heated wafer 600. The substrate etching process is performed by the above-described plasma processing unit 410. In the following description, it will be appreciated that an operation of each component of the plasma processing unit 410, alone or in combination with other components, may be controlled by the controller 470.

<Wafer Loading>

Before loading the wafer 600 into the processing chamber 445, it will be appreciated that the heater 463 (i.e., susceptor table 411) has been previously heated to a certain processing temperature. Also, by operating the vertical shaft 473, the lifter pin 413 has been previously lifted to a certain loading position. The wafer 600 is brought into the processing chamber 445 by a conveying means (finger, not shown), and mounted on the lifter pin 413 (wafer supporting component 414). By operating the vertical shaft 473, the lifter pin 413 is descended to a certain processing position, and the wafer 600 is moved and mounted onto the susceptor table 411.

<Heating Wafer and Adjusting Pressure>

The wafer 600 may be heated and adjusted to a certain processing temperature within a range, for example, from 180 degrees Celsius to 250 degrees Celsius by the heat conduction from the susceptor table 411, the radiation from the heater 463, and/or the cooling effect of the coolant. Also, by operating the exhausting device 479 and appropriately adjusting a certain degree of opening of the APC valve 481, exhaust is performed such that a pressure in the reaction container 431 and a pressure in the processing chamber 445 may be set to a certain pressure within a range, for example, from 30 Pa to 530 Pa.

<Processing Plasma>

When the temperature of the wafer 600 is raised to a certain processing temperature, exhaust is continuously performed in the reaction container 431 and the processing chamber 445. Simultaneously, the input/output valve 478 may be opened, and the gas supplying pipe 455 starts the supply of the processing gas. The processing gas supplied to the reaction container 431 may be dispersed by the baffle plate 460, and flows downwardly along the inner wall of the reaction container 431. At this point, by adjusting a degree to which the APC valve 481 is opened (e.g., based on a pressure that is detected by the pressure sensor) pressure in the reaction container 431 may be set to a certain processing pressure (vacuum degree).

When the pressure in the reaction container 431 becomes stable, the high frequency power source 444 applies high frequency power to the resonant coil 432. As a result, plasma discharge is performed in the plasma generating area 430, and the processing gas is transformed to a plasma state. At this point, free electrons of the processing gas are accelerated by an induction field that is excited inside the resonant coil 432, and collide with gas molecules, thereby exciting the gas molecules. The processing gas, now in the plasma state, flows from the plasma generating area 430 toward the processing chamber 445, and is applied onto the wafer 600. As a result, the surface of the wafer 600 (i.e., a thin film surface), which is formed on the wafer 600, is etched by plasma. By using the processing gas in the plasma state, the etching processing may be performed as the wafer 600 is being maintained at a low temperature.

In the above description, a tetrafluoromethane (CF4) gas or a trifluoromethane (CHF3) gas that is an etching gas may be used as the processing gas, but other types of gases are possible. Additionally, the flow rate of the processing gas that is adjusted by the mass flow controller 477, for example, may be set to be within a range from 800 sccm to 2600 sccm. A processing pressure may also be set, for example, to be within a range from 30 Pa to 530 Pa. Also, the high frequency power applied to the resonant coil 432 may be set, for example, to be within a range from 600 W to 2000 W. Additionally, an output frequency of the high frequency power source 444 may be added to a resonance frequency of the resonant coil 432. At this point, the RF sensor 468 monitors a reflected wave from the resonant coil 432, and transmits the monitored level of the reflected wave to the frequency matching box 446. The frequency matching box 446 adjusts the output frequency of the high frequency power source 444 such that the reflected wave or the power of the reflected wave is minimized Therefore, the output frequency of the high frequency power source 444 is immediately matched even when a flow rate of gas, a mixture ratio of gas, and/or a processing condition of a pressure are/is changed.

As described above and in some embodiments, when performing plasma processing, it is preferable to maintain the wafer 600 at a constant temperature. However, when the processing gas having the plasma state is supplied onto the wafer 600, the wafer 600 is heated by the radiant heat from the plasma as well as the heat conduction from the susceptor table 411 or the radiation from the heater 463. Accordingly, when the wafer 600 is heated by the heater 463, the wafer 600 may be heated at a temperature slightly lower than a desired temperature, in consideration of the temperature rising due to the plasma.

Moreover, when heating the wafer 600, the wafer 463 may be heated by the heater 463 without supplying the coolant to the flow path 426. As described above and in some embodiments, when performing the plasma processing, it is preferable to maintain the wafer 600 at a constant temperature. However, when the processing gas having the plasma state is supplied onto the wafer 600, the wafer 600 is heated by the radiant heat from the plasma as well as the heat conduction from the susceptor table 411 or the radiation from the heater 463. Therefore, when performing the plasma processing, the supply of power to the heater 463 is stopped, and the heater 463 stops heating the wafer 600. However, when desiring to maintain the temperature of the wafer 600 during the plasma processing, for example, at a low temperature lower than or equal to 90 degrees Celsius, it is sometimes difficult to prevent the temperature of the wafer 600 from rising by only stopping the heating of the susceptor table 411 by the heater 463.

Therefore, in some embodiments, when performing the plasma processing, the supply of power to the heater 463 may be stopped, while the coolant supplying component simultaneously starts the supply of the coolant to the flow path 420 and the discharging component starts the discharging of the coolant from the flow path 420. By supplying the coolant into the susceptor table 411, the heat dissipation of the wafer 600 is facilitated through the susceptor table 411, and thus, the rising temperature of the wafer 600 can be minimized. Also, in some embodiments, the liquid coolant, which has a higher specific heat and heat conductivity than that of gas, may be used as the medium that flows through the flow path 420. Therefore, the cooling efficiency of the susceptor table 411 can be increase compared to a case where gas is used as the medium.

Moreover, in some embodiments, referring again to FIGS. 2 and 3, one or more partitions 423 (423a and 423b) are disposed in the flow path 420 between the supplying hole 421a and the discharging hole 422a. Furthermore, the turning points of the flow path 420 of the coolant are respectively formed in the gap between the peripheral wall side partition 423a and the pillar-shaped member 424, and the gap between the pillar-shaped side partition 423b and the peripheral wall 411b. Therefore, the coolant meanders through the flow path 420 in a zigzag shape as it flows through the large area of the susceptor table 411. As a result, the in-surface temperature uniformity of the susceptor table 411 and wafer 600 can be enhanced, and thus, the in-surface uniformity of the plasma processing can be enhanced.

Moreover, in some embodiments, referring again to FIGS. 5A and 5B and 6A and 6B, the supplying hole 421a of the coolant supplying component and the discharging hole 422a of the discharging component may be disposed at respective positions that are away from the turning points. Therefore, the coolant may flow more evenly through the position that is away from the turning point. As a result, the stagnation of the coolant can be prevented, and thus, the entire area of the susceptor table 411, i.e., the entire surface of the wafer 600, can be cooled more uniformly, thereby enhancing the in-surface uniformity of the plasma processing.

Moreover, in some embodiments, referring again to FIG. 3, the gap 426 having a certain height may be formed between the partition 423 and the bottom portion 412 of the flow path 420. By providing the gap 426, the flow of the coolant can be prevented from being excessively disturbed by the partition 423. That is, although the coolant stagnates at the bottom portion 412 of the flow path 420, since the gap 426 may be formed near the bottom portion 412 of the flow path 420, the flow path of the coolant can be secured. As a result, the coolant may circulate without stagnation. In some embodiments, since the coolant flows evenly through the gap 426 as well as the gap between the turning points, a pressure applied to an end portion of the partition 423 can be reduced by the flow of the coolant, and thus, the flow path of the coolant can be better secured. Also, a change in the flow speed of the coolant can be prevented, and thus, the in-surface uniformity of the cooling efficiency can be better enhanced. Accordingly, the entire area of the susceptor table 411, i.e., the entire surface of the wafer 600, can be cooled more uniformly and efficiently, thus enhancing the in-surface uniformity of plasma processing.

After a certain time elapses, when the etching processing has been completed for the wafer 600, by stopping the supply of power from the high frequency power source 444 to the resonant coil 432, the generation of plasma is stopped. Furthermore, the supply of the processing gas is stopped from the gas supplying pipe 455 to the reaction container 431.

<Purging and Restoring to Atmospheric Pressure>

Exhaust is continuously performed in the reaction container 431 and the processing chamber 445, and the gas supplying pipe 455 starts the supply of a purge gas. When the purge has been completed in the reaction container 431 and the processing chamber 445, by adjusting a degree of opening of the APC valve 481, a pressure in the reaction container 431 and a pressure in the processing chamber 445 are restored to an atmospheric pressure. For the purge gas, an inert gas such as nitrogen ($N_2$) gas or a rare gas may be used, but other types of gases are possible.

<Wafer Unloading>

The processing-completed wafer 600 is unloaded from inside the processing chamber 445 in sequence opposite to the above-described wafer loading sequence, and the substrate processing process ends.

(4) Other Embodiments (a) According to some embodiments, when the plasma generating component generates plasma, the heater 463 stops the heating of the wafer 600, and the coolant supplying component simultaneously starts the supply of the coolant and the discharging component starts the discharging of the coolant. By supplying the coolant into the susceptor table 411, the heat dissipation of the wafer 600 may be facilitated through the susceptor table 411, and thus, the rising of the wafer 600 temperature can be minimized. When desiring to maintain the temperature of the wafer 600 during the plasma processing, for example, at a low temperature lower than or equal to 90 degrees Celsius, it is sometimes difficult to prevent the temperature of the wafer 600 from rising by only stopping the heating of the susceptor table 411 by the heater 463. To solve such limitations, according to some embodiments, the rising of the temperature of the wafer 600 can be minimized even at the low temperature lower than or equal to 90 degrees Celsius. Also, when the temperature of the wafer 600 is changed to a low temperature during plasma processing, for example, it becomes easier to increase an etching selectivity or perform a shape control.

(b) According to some embodiments, referring again to FIG. 2, the one or more partitions 423 may be disposed in the flow path 420 between the supplying hole 421a of the coolant supplying component and the discharging hole 422a of the discharging component. The partitions 423 are disposed to intersect the outer circumference direction of the peripheral wall 411b. The turning points of the flow path 420 of the coolant may be respectively formed in the gap between the peripheral wall sided partition(s) 423a and the pillar-shaped member 424, and the gap between the pillar-shaped sided partition(s) 423b and the peripheral wall 411b. By disposing the partition 423 in this way, the coolant meanders through the flow path 420 and flows in a zigzag shape. That is, the coolant flows uniformly through the large area of the susceptor table 411. As a result, the in-surface temperature uniformity of the susceptor table 411 and the wafer 600 can be enhanced, and thus, the in-surface uniformity of the plasma processing can be enhanced.

(c) According to some embodiments, referring again to FIGS. 5A and 5B, the supplying hole 421a of the coolant supplying component is disposed at a position that is away from the turning point. By disposing the supplying hole 421a of the coolant supplying component at this position, the coolant can flow more evenly through the position that is away from the turning point. As a result, the in-surface temperature uniformity of the susceptor table 411 and the wafer 600, namely, the in-surface uniformity of plasma processing, can be better enhanced.

(d) According to some embodiments, referring again to FIGS. 6A and 6B, the discharging hole 422a of the discharging component may be disposed at a position that is away from the turning point. By disposing the discharging hole 422a of the discharging component at this position, the coolant can flow more evenly through the position that is away from the turning point. As a result, the in-surface temperature uniformity of the susceptor table 411 and the wafer 600, namely, the in-surface uniformity during the plasma processing can be better enhanced.

(e) According to some embodiments, referring again to FIGS. 6A and 6B, the liquid coolant having a higher specific heat and heat conductivity than that of gas may be used as the medium that flows through the flow path 420. Therefore, the cooling efficiency of the susceptor table 411 can be increased compared to a case where gas is used as the medium. Additionally, when gas is used as the medium, since gas has relatively low specific heat and heat conductivity, it is sometimes difficult to cool the susceptor table 411. Also, since a cooling gas is required to flow at a high flow rate, for example, of several tens to hundreds L/min, the increase in cost arises.

(f) According to some embodiments, referring again to FIG. 3, the gap 426 having a certain height is formed between the partition 423 and the bottom portion 412 of the flow path 420. By providing the gap 426, the flowing of the coolant can be prevented from being excessively disturbed by the partition 423. That is, although the coolant stagnates at the bottom portion 412 of the flow path 420, since the gap 426 according to some embodiments is formed near the bottom portion 412 of the flow path 420, the flow path of the coolant may be further secured. As a result, the coolant can efficiently circulate without stagnation. According to some embodiments, also, since the coolant flows more evenly through the gap 426 as well as a gap between the turning points, a pressure applied to an end portion of the partition 423 can be reduced by the flow of the coolant, and thus, the flow path of the coolant can be further secured.

Also, the change of the flow speed of the coolant can be prevented, and thus, the in-surface uniformity of the cooling efficiency can be better enhanced. Accordingly, the entire area of the susceptor table 411, namely, the entire surface of the wafer 600, can be cooled more uniformly and efficiently.

<Some Other Embodiments>

In the above description, the embodiments of the present disclosure(s) have been described in detail, but are not limited to the above-described embodiments. The present disclosure(s) may be variously modified and/or combined within the scope of the present disclosure(s) and without deviating from subject matters of the present disclosure(s).

Figure 4A:
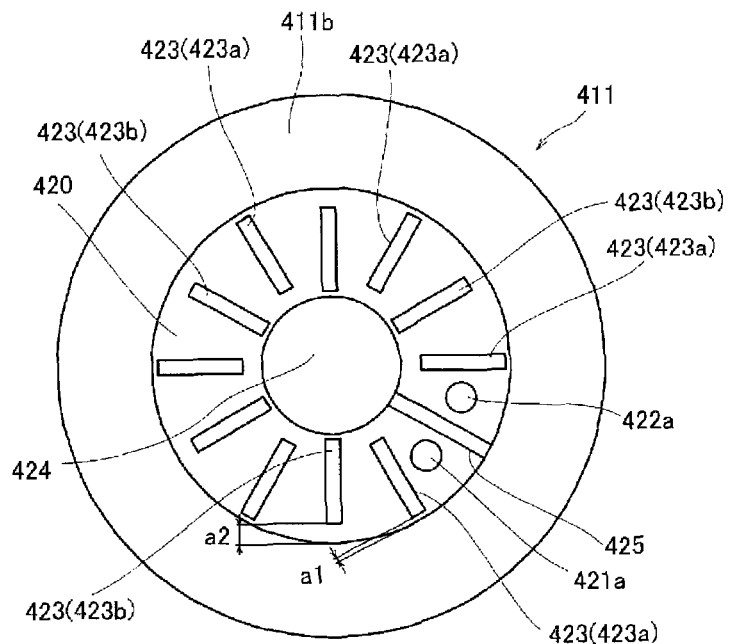
FIGS. 4A and 4B are views for illustrating a positional relationship between a partition and a peripheral wall of a substrate supporting table, according to some embodiments.
Figure 4B:
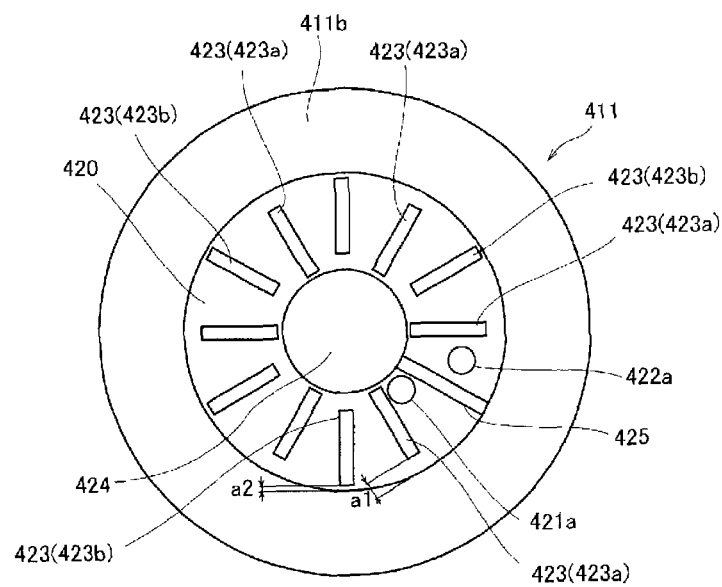

For example, the disposition of the partition 423 is not necessarily limited to the above-described configuration. FIGS. 4A and 4B are views for illustrating various modification examples of a positional relationship between the partition 423 and the peripheral wall 411b, according to some embodiments. In FIG. 4A, a distance "a2" between an end portion at the peripheral wall 411b side of the pillar-shaped sided partition 423b and the peripheral wall 411b is greater than a distance "a1" between an end portion at the peripheral wall 411b side of the peripheral wall sided partition 423a and the peripheral wall 411b. Also, in FIG. 4B, the distance "a2" between an end portion at the peripheral wall 411b side of the pillar-shaped sided partition 423b and the peripheral wall 411b is less than the distance "a1" between an end portion at the peripheral wall 411b side of the peripheral wall sided partition 423a and the peripheral wall 411b. By disposing the partition 423 in this way, most of the coolant flows by alternately passing through one of the peripheral wall 411b side and the pillar-shaped member 424 side whenever crossing the respective partition 423, and thus the coolant meanders through the flow path 420 and flows in a zigzag shape. That is, the coolant flows uniformly through the large area of the susceptor table 411. As a result, the in-surface temperature uniformity of the susceptor table 411 and the wafer 600 can be enhanced, and thus, the in-surface uniformity during the plasma processing can be enhanced.

Moreover, for example, the coolant is not limited to water ($H_2O$), and other inert liquids having insulation properties and/or is chemically stabilized may be used as the coolant. Also, fluorine-based liquids such as Galden (registered trademark) and Fluorinert (registered trademark) may be used as the coolant.

Moreover, for example, the position of the pillar-shaped member 424 is not necessarily limited to the above-described configuration. That is, the pillar-shaped member 424 is not limited to a case where the pillar-shaped member 424 is disposed near the center in a region surrounded by the peripheral wall 411b, and may be disposed deviated from the center. Also, the flow path 420 is not necessarily limited to the ring shape, and may be formed in any other shape, including but not limited to a spiral shape.

Moreover, the present disclosure is not limited to the above-described embodiments where the heater 463 heats the wafer 600 and simultaneously the coolant cools a susceptor 459, but may be applied even in a case where only cooling of the susceptor 459 with the coolant is performed. That is, the present disclosure may be appropriately applied to a case where only cooling of the susceptor 459 with the coolant is performed without heating the wafer 600 by the heater 463, for preventing the temperature rising of the wafer 600 due to plasma.

Moreover, in some embodiments, the susceptor 459 is fixed and the lifter pin 413 ascends/descends, but the present disclosure is not limited to thereto. As another example, the lifter pin 413 may be fixed, and the susceptor 459 may ascend/descend. By implementing such a configuration, a heater line for supplying power to the heater 463 may be disposed inside a susceptor supporting component, and thus, the heater line can be prevented from being exposed to plasma or processing gas. As a result, the tolerance of the susceptor 459 can be enhanced.

Moreover, the substrate processing apparatus according to the present disclosure is not limited to being applied to the above-described plasma processing unit, and may be applied even to other single-wafer substrate processing apparatus including, but not limited to, a diffusion processing unit, an oxidization or nitration processing unit, an ashing processing unit, a film formation processing unit and so on that includes the susceptor table 411 (substrate supporting table) capable of cooling.

According to some other embodiments, a substrate supporting table may include: a supporting plate configured to support a substrate; a peripheral wall configured to encompass a flow path of a coolant under the supporting plate, an upper end of the peripheral wall being enclosed by the supporting plate; a lower cover configured to enclose a bottom portion of the flow path and a lower end of the peripheral wall; a coolant supplying component configured to supply a coolant through an upstream input of the flow path; a discharging component configured to discharge the coolant through a downstream output of the flow path; and a partition disposed between a supplying hole of the coolant supplying component and a discharging hole of the discharging component, wherein a gap is formed between the partition and the bottom portion of the flow path.

Moreover, in some embodiments, the partition may be disposed in a radial direction which intersects with an outer circumference direction of the peripheral wall.

Moreover, in some embodiments, the partition may be disposed such that its elongated direction intersects with a flow direction of the coolant flowing in the flow path.

Moreover, in some embodiments, the partition may be disposed in plurality, and a distance between the peripheral wall and an end portion at the peripheral wall side of one partition of the plurality of partitions may differ from a distance between the peripheral wall and an end portion at the peripheral wall side of another partition adjacent to the one partition.

Moreover, in some embodiments, a pillar-shaped member may be disposed in a space which is surrounded by the peripheral wall, an inner wall which contacts the lower cover and connects the pillar-shaped member and the peripheral wall may be formed between the supplying hole of the coolant supplying component and the discharging hole of the discharging component, the supplying hole of the coolant supplying component may be formed between the partition and the inner wall, and when a distance between the peripheral wall and an end portion at the peripheral wall side of the partition is a first distance, a distance between the pillar-shaped member and an end portion at the pillar-shaped member side of the partition is a second distance, a distance between the end portion at the peripheral wall side of the partition and the supplying hole of the coolant supplying component is a third distance, and a distance between the end portion at the pillar-shaped member side of the partition and the supplying hole of the coolant supplying component is a fourth distance, the third distance may be shorter than the fourth distance in a case where the first distance is shorter than the second distance, the fourth distance may be shorter than the third distance in a case where the second distance is shorter than the first distance, and the third distance may be equal to the fourth distance in a case where the first distance is equal to the second distance.

Moreover, in some embodiments, a pillar-shaped member may be disposed in a space which is surrounded by the peripheral wall, an inner wall which contacts the lower cover and connects the pillar-shaped member and the peripheral wall may be formed between the supplying hole of the coolant supplying component and the discharging hole of the discharging component, the discharging hole of the discharging component may be formed between the partition and the inner wall, and when a distance between the peripheral wall and an end portion at the peripheral wall side of the partition is a first distance, a distance between the pillar-shaped member and an end portion at the pillar-shaped member side of the partition is a second distance, a distance between the end portion at the peripheral wall side of the partition and the discharging hole of the discharging component is a third distance, and a distance between the end portion at the pillar-shaped member side of the partition and the supplying hole of the coolant supplying component is a fourth distance, the third distance may be shorter than the fourth distance in a case where the first distance is shorter than the second distance, the fourth distance may be shorter than the third distance in a case where the second distance is shorter than the first distance, and the third distance may be equal to the fourth distance in a case where the first distance is equal to the second distance.

According to some other embodiments, a substrate processing apparatus includes: a processing chamber configured to process a substrate; a substrate supporting table disposed inside the processing chamber, and configured to support the substrate; a gas supplying component configured to supply processing gas into the processing chamber; a plasma generating component configured to change the processing gas, supplied to the processing chamber, into plasma; and an exhausting component configured to perform exhaust in the processing chamber, wherein, the substrate supporting table includes: a supporting plate configured to support the substrate; a peripheral wall configured to encompass a flow path being configured to pass a coolant under the supporting plate, an upper end of the peripheral wall being enclosed by the supporting plate; a lower cover configured to enclose a bottom portion of the flow path and a lower end of the peripheral wall; a coolant supplying component configured to supply a coolant through an upstream input of the flow path; a discharging component configured to discharge the coolant through a downstream output of the flow path; and a partition disposed between a supplying hole of the coolant supplying component and a discharging hole of the discharging component, wherein a gap is formed between the partition and the bottom portion of the flow path, and the substrate processing apparatus includes a control component configured to allow the coolant supplying component to supply the coolant and allow the discharging component to discharge the coolant, when the plasma generating component is generating the plasma.

According some other embodiments, a substrate processing apparatus includes: a processing chamber configured to process a substrate; a substrate supporting table disposed inside the processing chamber, and configured to support the substrate; a heating component configured to heat the substrate supported by the substrate supporting table; a gas supplying component configured to supply a processing gas into the processing chamber; a plasma generating component configured to change the processing gas, supplied to the processing chamber, into plasma; and an exhausting component configured to perform exhaust in the processing chamber, wherein, the substrate supporting table includes: a supporting plate configured to support the substrate; a peripheral wall configured to encompass a flow path of a coolant under the supporting plate, an upper end of the peripheral wall being enclosed by the supporting plate; a lower cover configured to enclose a bottom portion of the flow path and a lower end of the peripheral wall; a coolant supplying component configured to supply a coolant through an upstream input of the flow path; a discharging component configured to discharge the coolant through a downstream output of the flow path; and a partition disposed between a supplying hole of the coolant supplying component and a discharging hole of the discharging component, wherein a gap is formed between the partition and the bottom portion of the flow path, and the substrate processing apparatus includes a control component configured to allow the heating component to stop heating of the substrate, and simultaneously allow the coolant supplying component to start the supply of the coolant and allow the discharging component to start the discharging of the coolant, when the plasma generating component starts the generation of the plasma.

According to some other embodiments, a method for manufacturing a semiconductor device includes: loading a substrate into a processing chamber; supporting the substrate by a substrate supporting table, the substrate supporting table being disposed inside the processing chamber and including: a supporting plate configured to support the substrate; a peripheral wall configured to encompass a flow path of a coolant under the supporting plate, an upper end of the peripheral wall being enclosed by the supporting plate; a lower cover configured to enclose a bottom portion of the flow path and a lower end of the peripheral wall; a coolant supplying component configured to supply a coolant through an upstream input of the flow path; a discharging component configured to discharge the coolant through a downstream output of the flow path; and a partition disposed between a supplying hole of the coolant supplying component and a discharging hole of the discharging component, wherein a gap is formed between the partition and the bottom portion of the flow path; supplying a processing gas into the processing chamber to perform exhaust and simultaneously process the substrate with plasma generated from the processing gas supplied into the processing chamber; and unloading the processed substrate from inside the processing chamber, wherein, when processing the substrate with the plasma, the coolant supplying component supplies the coolant and the discharging component discharges the coolant.

According to some other embodiments, a method for manufacturing a semiconductor device includes: loading a substrate into a processing chamber; supporting the substrate by a substrate supporting table, the substrate supporting table being disposed inside the processing chamber and including: a supporting plate configured to support the substrate; a peripheral wall configured to encompass a flow path of a coolant under the supporting plate, an upper end of the peripheral wall being enclosed by the supporting plate; a lower cover configured to enclose a bottom portion of the flow path and a lower end of the peripheral wall; a coolant supplying component configured to supply a coolant through an upstream input of the flow path; a discharging component configured to discharge the coolant through a downstream output of the flow path; and a partition disposed between a supplying hole of the coolant supplying component and a discharging hole of the discharging component, wherein a gap is formed between the partition and the bottom portion of the flow path; heating the substrate, supported by the substrate supporting table, by a heating component; supplying a processing gas into the processing chamber to perform exhaust and simultaneously process the substrate with plasma generated from the processing gas supplied into the processing chamber; and unloading the processed substrate from inside the processing chamber, wherein, when processing the substrate with the plasma, the heating component stops the heating of the substrate, and simultaneously the coolant supplying component starts the supply of the coolant and the discharging component starts the discharging of the coolant.

The substrate supporting table, the substrate processing apparatus, and the manufacture method for the semiconductor device, according to the present disclosure, can prevent the flowing of the coolant from being excessively disturbed by the partition even when using the liquid (coolant) as the cooling medium, thus enhancing the cooling efficiency of the substrate supporting table.

While certain embodiments have been described, these embodiments have been presented by way of example only, and are not intended to limit the scope of the disclosures. Indeed, the novel systems, methods, devices, and apparatuses described herein may be embodied in a variety of other forms or may be combined; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate supporting table, comprising:
   a supporting plate configured to support a substrate;
   a cylindrical peripheral wall, an upper end of the peripheral wall being enclosed by the supporting plate;
   a lower cover configured to enclose a lower end of the peripheral wall;
   a pillar-shaped member connecting the supporting plate and the lower cover and disposed in a region surrounded by the peripheral wall;
   a ring-shaped flow path of a liquid coolant being between the peripheral wall and the pillar-shaped member and configured to pass the liquid coolant in one direction along the ring-shaped flow path;
   a supplying hole formed at an upstream input of the ring-shaped flow path;
   a discharging hole formed at a downstream output of the ring-shaped flow path;
   an inner wall configured to contact the lower cover and connect the pillar-shaped member to the peripheral wall, the inner wall being between the supplying hole and the discharging hole such that a flow of the liquid coolant from the supplying hole to the discharging hole opposite to the one direction along the ring-shaped flow path is prevented by the inner wall; and
   partitions disposed in the ring-shaped flow path between the supplying hole and the discharging hole, and configured to form a gap between each of the partitions and a bottom portion of the ring-shaped flow path, the partitions intersecting with the ring-shaped flow path such that a flow direction of the liquid coolant passing through the gap intersects with an elongate direction of the partitions,
   wherein a distance between the peripheral wall and an end portion, which faces the peripheral wall, of at least one of the partitions is different from a distance between the peripheral wall and an end portion, which faces the peripheral wall, of at least another one of the partitions adjacent to the at least one partition, and
   wherein each partition of a pair of adjacent partitions is spaced apart from the peripheral wall and the pillar-shaped member at different distances.

2. The substrate supporting table of claim 1, wherein the partitions are disposed in a radial direction which intersect with an outer circumference direction of the peripheral wall.

3. The substrate supporting table of claim 1,
   wherein the supplying hole is formed between a partition among the partitions adjacent to the supplying hole and the inner wall, and
   wherein a direct distance between the peripheral wall and an end portion, which faces the peripheral wall, of the partition adjacent to the supplying hole is shorter than a direct distance between the pillar-shaped member and an end portion, which faces the pillar-shaped member, of the partition adjacent to the supplying hole, and a direct distance between the end portion, which faces the peripheral wall, of the partition adjacent to the supplying hole and the supplying hole is shorter than a direct distance between the end portion, which faces the pillar-shaped member, of the partition adjacent to the supplying hole and the supplying hole.

4. The substrate supporting table of claim 1,
   wherein the discharging hole is formed between a partition among the partitions adjacent to the discharging hole and the inner wall, and
   wherein a direct distance between the peripheral wall and an end portion, which faces the peripheral wall, of the partition adjacent to the discharging hole is shorter than a direct distance between the pillar-shaped member and an end portion, which faces the pillar-shaped member, of the partition adjacent to the discharging hole, and a direct distance between the end portion, which faces the peripheral wall, of the partition adjacent to the discharging hole and the discharging hole is shorter than a direct distance between the end portion, which faces the pillar-shaped member, of the partition adjacent to the discharging hole and the discharging hole.

5. The substrate supporting table of claim 1,
   wherein the supplying hole is formed between a partition among the partitions adjacent to the supplying hole and the inner wall, and
   wherein a direct distance between the pillar-shaped member and an end portion, which faces the pillar-shaped member, of the partition adjacent to the supplying hole is shorter than a direct distance between the peripheral wall and an end portion, which faces the peripheral wall, of the partition adjacent to the supplying hole, and a direct distance between the end portion, which faces the pillar-shaped member, of the partition adjacent to the supplying hole and the supplying hole is shorter than a direct distance between the end portion, which faces the peripheral wall, of the partition adjacent to the supplying hole and the supplying hole.

6. The substrate supporting table of claim 1,
   wherein the discharging hole is formed between a partition among the partitions adjacent to the discharging hole and the inner wall, and
   wherein a direct distance between the pillar-shaped member and an end portion, which faces the pillar-shaped member, of the partition adjacent to the discharging hole is shorter than a direct distance between the peripheral wall and an end portion, which faces the peripheral wall, of the partition adjacent to the discharging hole, and a direct distance between the end portion, which faces the pillar-shaped member, of the partition adjacent to the discharging hole and the discharging hole is shorter than a direct distance between the end portion, which faces the peripheral wall, of the partition adjacent to the discharging hole and the discharging hole.

7. A substrate processing apparatus, comprising:
a processing chamber configured to process a substrate;
a substrate supporting table disposed inside the processing chamber, and configured to support the substrate;
a gas supplying component configured to supply a processing gas into the processing chamber;
a plasma generating component configured to transform the processing gas, supplied to the processing chamber, into plasma; and
an exhausting component configured to perform exhaust in the processing chamber,
wherein, the substrate supporting table comprises: a supporting plate configured to support the substrate; a cylindrical peripheral wall, an upper end of the peripheral wall being enclosed by the supporting plate; a lower cover configured to enclose a lower end of the peripheral wall; a pillar-shaped member connecting the supporting plate and the lower cover and disposed in a region surrounded by the peripheral wall; a ring-shaped flow path of a liquid coolant being between the peripheral wall and the pillar-shaped member and configured to pass the liquid coolant in one direction along the ring-shaped flow path; a supplying hole formed at an upstream input of the ring-shaped flow path; a discharging hole formed at a downstream output of the ring-shaped flow path; an inner wall configured to contact the lower cover and connect the pillar-shaped member to the peripheral wall, the inner wall being between the supplying hole and the discharging hole such that a flow of the liquid coolant from the supplying hole to the discharging hole opposite to the one direction along the ring-shaped flow path is prevented by the inner wall; and partitions disposed in the ring-shaped flow path between the supplying hole and discharging hole, and configured to form a gap between each of the partitions and a bottom portion of the ring-shaped flow path, the partitions intersecting with the ring-shaped flow path such that a flow direction of the liquid coolant passing through the gap intersects with an elongate direction of the partitions,
wherein a distance between the peripheral wall and an end portion, which faces the peripheral wall, of at least one of the partitions is different from a distance between the peripheral wall and an end portion, which faces the peripheral wall, of at least another one of the partitions adjacent to the at least one partition,
wherein the substrate processing apparatus comprises a control component configured to control a supply of the liquid coolant and control a discharge of the liquid coolant, when the plasma is generated, and
wherein each partition of a pair of adjacent partitions is spaced apart from the peripheral wall and the pillar-shaped member at different distances.

8. The substrate processing apparatus of claim 7, wherein the discharging hole is formed between a partition among the partitions adjacent to the discharging hole and the inner wall, and
wherein a direct distance between the peripheral wall and an end portion, which faces the peripheral wall, of the partition adjacent to the discharging hole is shorter than a direct distance between the pillar-shaped member and an end portion, which faces the pillar-shaped member, of the partition adjacent to the discharging hole, and a direct distance between the end portion, which faces the peripheral wall, of the partition adjacent to the discharging hole and the discharging hole is shorter than a direct distance between the end portion, which faces the pillar-shaped member, of the partition adjacent to the discharging hole and the discharging hole.

9. The substrate processing apparatus of claim 7, wherein the supplying hole is formed between a partition among the partitions adjacent to the supplying hole and the inner wall, and
wherein a direct distance between the peripheral wall and an end portion, which faces the peripheral wall, of the partition adjacent to the supplying hole is shorter than a direct distance between the pillar-shaped member and an end portion, which faces the pillar-shaped member, of the partition adjacent to the supplying hole, and a direct distance between the end portion, which faces the peripheral wall, of the partition adjacent to the supplying hole and the supplying hole is shorter than a direct distance between the end portion, which faces the pillar-shaped member, of the partition adjacent to the supplying hole and the supplying hole.

10. The substrate supporting table of claim 7,
wherein the discharging hole is formed between a partition among the partitions adjacent to the discharging hole and the inner wall, and
wherein a direct distance between the pillar-shaped member and an end portion, which faces the pillar-shaped member, of the partition adjacent to the discharging hole is shorter than a direct distance between the peripheral wall and an end portion, which faces the peripheral wall, of the partition adjacent to the discharging hole, and a direct distance between the end portion, which faces the pillar-shaped member, of the partition adjacent to the discharging hole and the discharging hole is shorter than a direct distance between the end portion, which faces the peripheral wall, of the partition adjacent to the discharging hole and the discharging hole.

11. The substrate supporting table of claim 7,
wherein the supplying hole is formed between a partition among the partitions adjacent to the supplying hole and the inner wall, and
wherein a direct distance between the pillar-shaped member and an end portion, which faces the pillar-shaped member, of the partition adjacent to the supplying hole is shorter than a direct distance between the peripheral wall and an end portion, which faces the peripheral wall, of the partition adjacent to the supplying hole, and a direct distance between the end portion, which faces the pillar-shaped member, of the partition adjacent to the supplying hole and the supplying hole is shorter than a direct distance between the end portion, which faces the peripheral wall, of the partition adjacent to the supplying hole and the supplying hole.

* * * * *